April 8, 1958 C. S. FULLER 2,829,422
METHODS OF FABRICATING SEMICONDUCTOR SIGNAL TRANSLATING DEVICES
Filed May 21, 1952 3 Sheets-Sheet 1
FIG. 1A
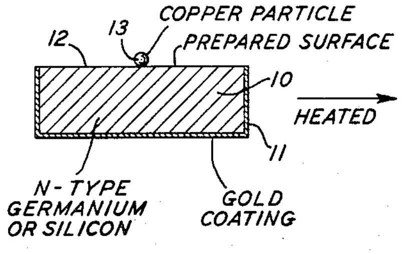
FIG. 1B
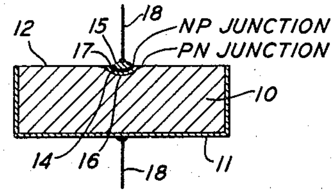
FIG. 1C
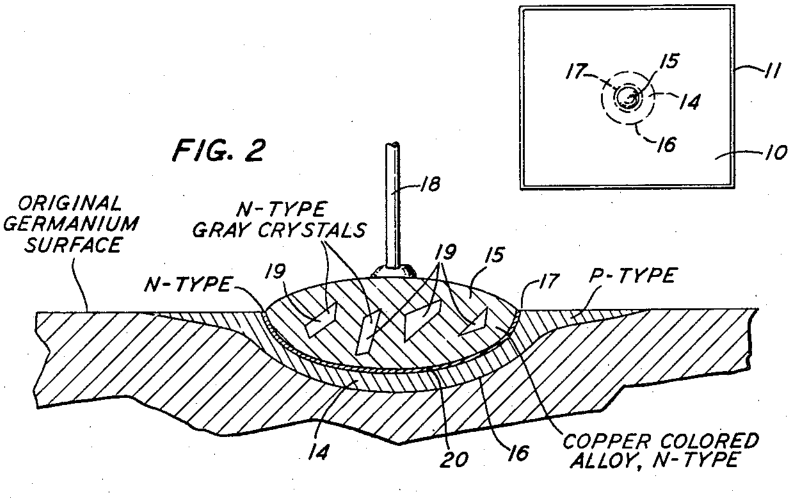
FIG. 2
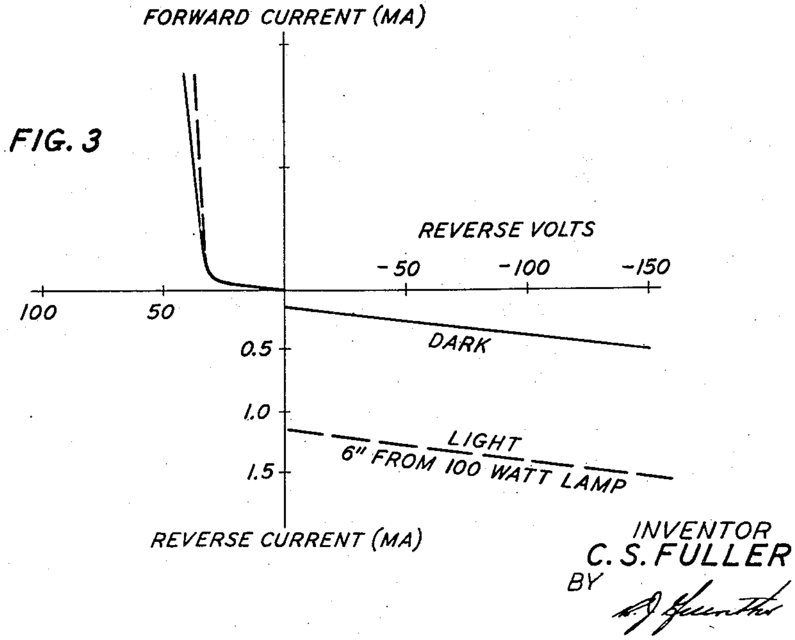
FIG. 3
INVENTOR
C. S. FULLER
BY
[signature]
ATTORNEY INVENTOR
C. S. FULLER
BY [signature]
ATTORNEY INVENTOR
C. S. FULLER
BY [signature]
ATTORNEY United States Patent Office 2,829,422

Patented Apr. 8, 1958

2,829,422

METHODS OF FABRICATING SEMICONDUCTOR SIGNAL TRANSLATING DEVICES

Calvin S. Fuller, Chatham, N. J., assignor to Bell Telephone Laboratories, Incorporated, New York, N. Y., a corporation of New York Application May 21, 1952, Serial No. 289,130

7 Claims. (Cl. 29—25.3)

This invention relates to semiconductor signal translating devices and more particularly to the fabrication of such devices wherein the semiconductive body comprises two or more contiguous zones of opposite conductivity types, that is N-type and P-type.

Such semiconductive bodies, for example of germanium or silicon, find application in a variety of devices, for example in rectifiers and photocells of the type illustrated in the application Serial No. 638,351, filed December 29, 1945 of J. H. Scaff and H. C. Theuerer now United States Patent No. 2,602,211, and in transistors of the class disclosed in United States Patent No. 2,569,347, granted September 25, 1951, to W. Shockley. Salient among the important characteristics of the semiconductive bodies are the uniformity and configuration of the barrier, commonly referred to as an NP or PN junction, between or defined by contiguous zones of opposite conductivity types, the Zener voltage of the junctions, a parameter discussed in detail in the application Serial No. 211,212, filed February 16, 1951 of W. Shockley, now United States Patent No. 2,714,702 and, particularly in the case of transistors, the carrier lifetimes in the semiconductive material.

One general object of this invention is to facilitate the production of NP junctions in semiconductive bodies.

More specific objects of this invention are to expedite the fabrication of semiconductive bodies having therein one or more NP junctions, to enable the controlled formation of such junctions of prescribed configuration, to realize conversion in conductivity type of regions of N-type material without substantial degradation in the carrier lifetimes for the bulk material, to produce junctions having high Zener voltages and to facilitate the formation of regions of NPN configuration and particularly advantageous for utilization at the collector in transistors.

The invention is predicated in part upon the discovery that the element copper is extremely effective in the conversion of N-type germanium or silicon to P-type by diffusion thereof into the semiconductor and that the entrance of copper into the semiconductor is very rapid and amenable to precise control.

In one illustrative embodiment of this invention, a semiconductive body for use in signal translating devices is fabricated by cleaning one face of a wafer of N conductivity type germanium or silicon, placing a particle of copper upon the face, heating the assembly to diffuse copper into the wafer, and then cooling the assembly. The heating is effected in air or in an inert atmosphere, for example helium, at a temperature between about 600° C. and 900° C. and for a period of a few seconds to of the order of one hundred twenty seconds. As a result of the heating, the copper enters the germanium or silicon and converts a region therein to P conductivity type. The cooling, which may be by quenching, effects an alteration in the character of a zone of the body adjacent the position of the initial particle in a manner which will be discussed hereinafter. Both the region and the zone mentioned are dished in form and symmetrical about the position of the initial particle.

The semiconductive body thus produced comprises a bulk of N conductivity type, a region of P conductivity type contiguous with the bulk and forming therewith a PN junction conforming generally to a portion of a sphere and intersecting the surface aforementioned, and an N zone within the P region and defining therewith an NP junction which also intersects the surface noted. The NPN volume thus formed is particularly useful to advantage as the collector region in a transistor.

In some applications, for example in rectifiers and certain photoresponsive devices, it is desirable that there be but a single NP junction. Semiconductive elements for these applications may be fabricated in accordance with the general method above described by, in effect, short circuiting the junction between the P region and the N zone enclosed thereby. This may be accomplished readily by fusing a metal over this junction, for example concomitantly with the heating of the copper. In an illustrative case, particles of copper and of indium are placed in contact on the cleaned germanium or silicon surface and the assembly is heated and cooled as before described. As a result, copper passes readily into the germanium to produce an NPN volume. The indium, however, remains essentially at the surface but fuses to the semiconductor and bridges the inner of the two junctions at the surface, whereby the resultant semiconductive body is electrically of PN configuration.

The configuration of the inner junction and properties of the bulk material following the treatment to diffuse copper into the semiconductive body are dependent upon the environment in which the heating is conducted. Specifically, any copper present as a contaminant in the heating apparatus or upon the body would diffuse thereinto and alter the conductivity or conductivity type of the bulk material or of a portion thereof. The magnitude of the practical problem thus presented will be appreciated when it is noted that as little as $10^{-9}$ grams of copper per square centimeter of surface area can result in the formation of deep junctions in germanium of resistivity of about 10 ohm centimeter. Such conversion, it is true, can be reversed by an annealing treatment but the treatment, it has been found, reduces the carrier lifetimes in the bulk material and, hence, degrades an important performance parameter of devices in which the material is utilized. Further, such annealing would modify or destroy the desired NP junction.

It has been determined that a coating of gold on germanium and silicon greatly reduces the entrance of unwanted contaminants into the body but does not prevent the diffusion of copper to produce junctions in accordance with this invention provided that an adequate quantity of copper is provided adjacent the region where the diffusion is desired.

In accordance with one feature of this invention, in the fabrication of junctions as heretofore described, the surfaces of the semiconductor are cleaned thoroughly and then plated with gold. The copper particle then is placed in the desired position upon one of the surfaces. Heating of the assembly results in diffusion of the copper, and conversion, only at the desired region. Thus, an NP junction is produced only at the prescribed position and without substantial degradation in the lifetime and other characteristics of the bulk material.

The invention and the several features thereof will be understood more clearly and fully from the following detailed description with reference to the accompanying drawing in which:

Figs. 1A and 1B are sectional views of a semiconductive body illustrating the composition thereof before and after diffusion of copper thereinto in accordance with this invention;

Fig. 1C is a plan view of the body shown in Fig. 1B;

Fig. 2 is a fragmentary sectional view to an enlarged scale of a portion of the element depicted in Figs. 1B and 1C;

Fig. 3 is a graph portraying performance characteristics of a typical device of the construction depicted in Figs. 1B and 1C;

Figures 4A, 4B, 4C, 4D:
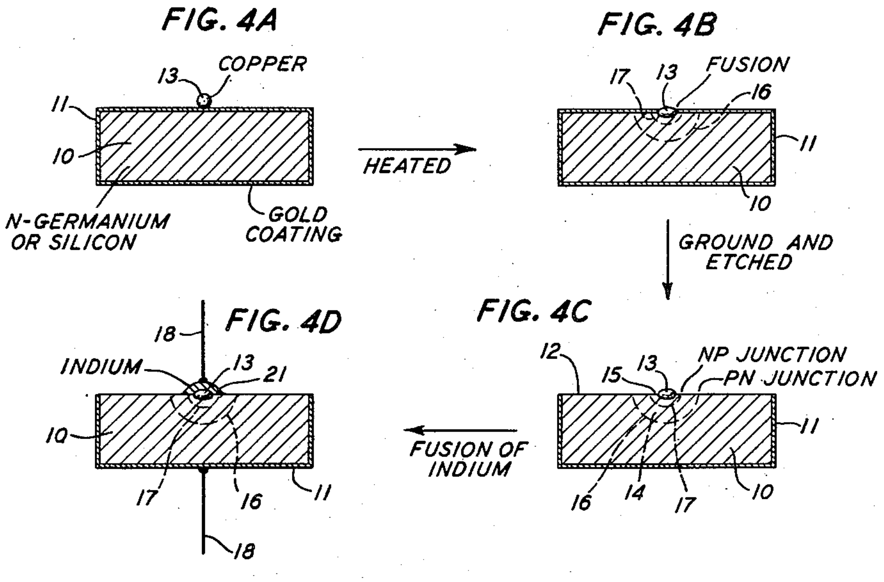
Figs. 4A to 4D illustrate in sequence the constitution of another semiconductor body fabricated in accordance with this invention.

Referring now to the drawing, in the fabrication of a signal translating device of the construction and in the manner represented in Fig. 1, a wafer 10 of semiconductive material of N conductivity type is employed. All of the surfaces of the wafer are cleaned to remove any contaminants therefrom and in such manner as to forestall entrance of any undesired impurities into the material. This may be accomplished advantageously by dry grinding the surfaces with an abrasive paper known commercially as Aloxite paper, or silicon carbide paper and removing loose particles by a filtered air blast. In the grinding operation, use of any material, for example tap water, known or suspected to contain copper even in minute traces should be avoided. Also care should be exercised to avoid any substantial increase in the temperature of the surface being treated.

Following the cleansing step, the wafer is coated on all surfaces with a layer of gold, indicated at 11 in Fig. 1. This may be effected advantageously by plating in a gold cyanide bath, the semiconductor being suspended therein by gold plated supports, e. g. tweezers. Then the wafer with the gold coating is heated to fuse the gold to the semiconductor.

The gold plating may be removed from one face, say the surface 12, of the semiconductor as by grinding with Aloxite paper, precautions being taken, as in the cleaning step above described, to prevent contamination of the semiconductor surface. Following this a particle 13 of copper is placed upon the surface 12 and the assembly heated in an inert atmosphere, for example helium, to effect diffusion of the copper into the body 10. Finally, the surface 12 is etched chemically and leads 18 are attached to the gold coating 11 and to the surface 12 at the initial position of the copper particle 13.

In a particular and illustrative case, the wafer 10 may be of single crystal germanium produced in the manner disclosed in the application Serial No. 138,354 filed January 13, 1950 of J. B. Little and G. K. Teal now United States Patent No. 2,683,676. The wafer may be square, 200 mils on a side and 40 mils thick, and the material of about 1.4 ohm centimeter resistivity. The gold plating may be 0.1 mil thick and fused to the germanium by heating the coated wafer at 500° C. for twenty seconds. The particle 13 may be a piece of pure copper of about 0.001 gram in weight and the copper diffusion effected by heating in helium for thirty-five seconds at 810° C., the period including a rise time of about fifteen seconds.

As illustrated in Figs. 1B and 1C and in greater detail in Fig. 2, in the wafer fabricated as above described there appears a dish shaped zone 14 of P conductivity type and defining a PN junction 16 with the bulk of the wafer, and an N-type zone 15 within the P zone 14 and defining a second NP junction 17 therewith. Both the junctions 16 and 17, it will be noted, intersect the surface 12 and are of circular configuration at this surface, as portrayed in Fig. 1C. For the specific case above described, the junction 16 is about 40 mils in diameter at the surface 12 and at a maximum depth of 15 mils below the surface 12. Specifically, as determined by analysis and as portrayed in Fig. 2, the region 15 is of copper colored germanium alloy of N-type and having scattered grey N-type crystals 19 therein; under this zone is a thin layer 20, of the order of one-half mil in thickness, of N-type; and contiguous with the layer 20 is the P zone 14 of the order of three mils thick.

Electrically, then, viewed between the terminals or leads 18, the semiconductor wafer is of NPN configuration. The PN junction 16 is characterized by a high Zener voltage, above 200 volts having been obtained in illustrative constructions. In general, the two junctions 16 and 17 are dissimilar, the former having a higher Zener voltage and being very sensitive to light whereas the latter exhibits a much lower Zener voltage and is relatively insensitive to light. Typical performance characteristics for a germanium device of the construction depicted in Fig. 1B are portrayed in Fig. 3 for both the dark condition and with the surface 12 of the body illuminated from a 100-watt lamp positioned 6 inches from the surface noted; the reverse volts in this figure correspond to the bulk of the body positive and the zone 15 negative.

It will be noted that the heating to effect diffusion of the copper does not result in conversion in conductivity or type of any of the bulk material masked by the gold plating 11 so that no degradation in the carrier lifetimes of the major portion of the wafer obtains.

The formation of the NPN region in the wafer may be explained in the following manner. Copper diffuses very readily and rapidly into germanium at temperatures between about 600° C. and the melting point of germanium. It acts as an acceptor. Thus, when copper is heated in contact with germanium, it diffuses into the wafer to effect a conversion of the N-type material to P-type. When the combination is cooled either or both of two effects may occur to result in the formation of the N-type zone 15. First, copper may diffuse outwardly in the direction from the junction 16 and secondly a recrystallization of the copper-germanium matrix may occur to result in the crystals 19 and the N-type alloy 15 illustrated in Fig. 2.

The extent and nature of the conversion due to the copper are dependent upon a number of factors, notably the resistivity of the initial material and the time and temperature of the heating. The longer the time of heating, the greater is the penetration of the copper and, hence, the deeper and larger is the junction 16. Also, the higher the temperature the more rapid is the diffusion of the copper into germanium. For example, in typical cases, for 10 ohm centimeter germanium and thirty seconds heating time, the junction 16 advances into the germanium wafer at an average rate of about 0.4 mil per second for a heating temperature of 650° C. and at an average rate of about 1 mil per second for a heating temperature of about 900° C. Suitable junctions may be produced, it has been found by heating at between about 600° C. and 900° C. for periods of about five to one hundred twenty seconds. The depth of penetration and the location of the junction 16 increases as the conductivity of the initial germanium decreases. For example, in a typical case similar to that above described but wherein the initial N-type germanium was of about 10 ohm centimeter resistivity and the heating was at 820° C. for sixty seconds, the junction 16 had a diameter of 100 mils at the surface 12 and a maximum depth of 40 mils.

Figs. 4A to 4D illustrate another embodiment of this invention, specifically the fabrication of a diode having advantageous rectifier and photocell characteristics. As represented in Fig. 4A, the N-type semiconductor wafer 10 is cleaned and provided with a coating of gold on all of its surfaces in the manner described hereinabove, and a particle 13 of copper is placed on one of the coated surfaces. The assembly is heated to diffuse copper into the semiconductor thereby to form in the body NP junctions 16 and 17 as illustrated in Fig. 4B, the copper passing readily through the gold and into the semiconductor. Also, as in the case of the fabrication of the device illustrated in Fig. 1, the upper face, in Fig. 4, of the assembly is ground and etched thereby to produce a unit of the form illustrated in Fig. 4C.

Following this, a small piece of indium 21 of size sufficient to overlie the junction 17, is placed on the surface 12 and over the region 15 and the unit heated in an inert atmosphere, e. g. helium, to fuse the indium to the wafer. The surface 12 then may be etched lightly.

In the completed unit, shown in Fig. 4D, the indium bridges the junction 17 so that electrically, as viewed between the leads 18, the semiconductor is of NP construction.

In an illustrative case, the wafer 10 was of 14 ohm centimeter N germanium and forty mils thick, the heating to diffuse the copper was at 860° C. for thirty-five seconds in helium and the unit was quenched in two seconds by placing it upon an iron plate. The indium was fused in helium at 450° C. The junction 16 produced had a diameter of thirty mils at the surface 12 and extended about 15 mils into the wafer 10.

Figure 5:
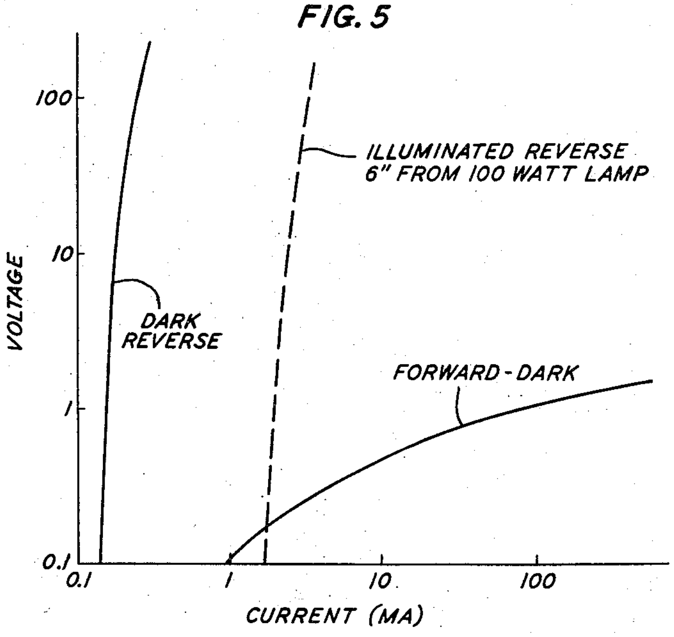
Fig. 5 is a graph representing typical performance characteristics of a translating device of the construction shown in Fig. 4D.

Operating characteristics for the device fabricated in accordance with the specific parameters set forth in the preceding paragraph are represented in Fig. 5. The forward illuminated curve, not shown, is essentially identical with the forward curve presented. Particularly to be noted are the large rectification ratio, the constancy of the reverse currents to high values of voltage and the photoelectric sensitivity of the junction. The device illustrated in Fig. 4D, therefore, is eminently suitable for use as a high voltage rectifier or photocell.

Although in the specific example described, the gold fusion, copper diffusion and indium fusion were effected by separate heatings, two or all three of these may be accomplished simultaneously. For example, the plated gold wafer with the copper particle thereon may be heated thereby to fuse the gold to the semiconductor and diffuse copper into the body. Also a piece of indium may be placed over the copper particle, or the copper particle embedded in an indium particle, and the fusion of gold and indium with the germanium caused concomitantly with the diffusion of the copper, all in a single heating period. Neither gold nor indium diffuses into germanium appreciably at the temperatures at which rapid entrance of the copper into the germanium can be realized.

Figure 6A:
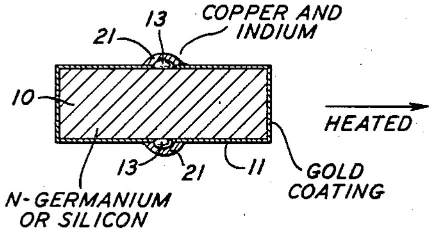
Fig. 6A, 6B and 6C illustrate the fabrication of an NPN semiconductor translating device in accordance with this invention.
Figure 6B:
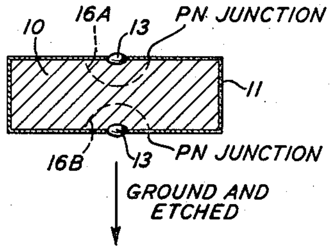
Figure 6C:
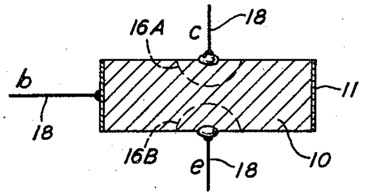

Figs. 6A, 6B and 6C portray the fabrication of a junction transistor of PNP configuration, in accordance with this invention. As there illustrated two particles, each of a copper element embedded in an indium element of appropriate size, are placed in contact with opposite major faces of an N-type semiconductor wafer 10 which has been cleaned and gold plated as described hereinabove. The assembly then is heated to diffuse the copper into the germanium and fuse the indium. The latter bridges the junction 17 in each case so that, as depicted in Fig. 6B, electrically the semiconductor has therein two PN junctions 16A and 16B. The major faces of the wafer are then ground and etched in the manner described hereinabove to produce a unit, as shown in Fig. 6C of NPN configuration to which emitter, base and collector connections 18 are made as illustrated.

In an illustrative case of fabrication of a device in accordance with Fig. 6, the body 10 was of N-type germanium of 13.6 ohm centimeter resistivity, the copper particles 13 were of five micrograms each pressed into indium particles of about four times the copper volume and the diffusion was accomplished by heating in helium for fifteen seconds at 820° C. The copper-indium particles may be attached individually to the gold-plated body by heating in helium at 450° C.

Figure 7A:
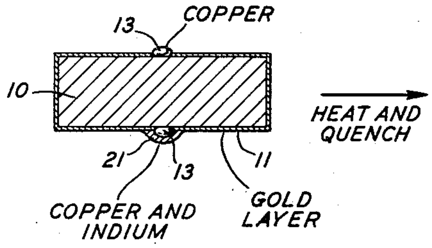
Figs. 7A, 7B and 7C portray several stages in the construction, in accordance with this invention, of another form of translating device.
Figure 7B:
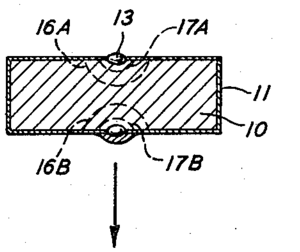
Figure 7C:
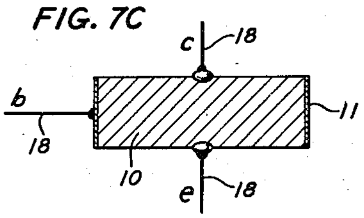

As illustrated in Figs. 7A, 7B and 7C, the invention may be utilized also in the manufacture of junction transistors having a so-called "hook collector" leading to attainment of high values for the current multiplication factor commonly known as alpha. As portrayed in these figures, a particle of copper is placed upon one face of an N-type semiconductor wafer 10 priorly cleaned and gold coated as described hereinabove, and a particle of copper embedded in indium is placed in contact with the opposite face of the wafer. After heating to produce diffusion of the copper the semiconductor includes two pairs of junctions 16A and 17A, and 16B and 17B, the junctions 17B being bridged by indium. Thus, the wafer includes an NP emitter region adjacent the junction 16B and an PN collector region adjacent the junctions 16A and 17A. Base, emitter and collector connections 18 are made to the body as illustrated in Fig. 7C.

Although in the foregoing description reference has been made particularly to the fabrication of germanium devices, it may be utilized also in the production of silicon devices. In general, the times requisite for prescribed depth of diffusion of copper into silicon are similar to germanium at approximately 350° C. greater temperature.

Also although in the foregoing description particular reference has been made to particles of pure copper, similar results can be achieved by employing copper alloys, for example brass. Further, although in the embodiments specifically described, copper particles have been disclosed whereby dished junctions physically symmetrical about the point of application of the particle are obtained, thin, e. g. one mil diameter, copper wires contacting the semiconductor surface sidewise may be utilized to produce elongated junctions. Also alloys of indium and copper may be used.

Finally, it may be noted that in some applications, the properties of the N zone or region 15 may be controlled by fusing or diffusing a significant impurity, such as antimony, a donor, into the semiconductor concurrently with or separately from the diffusion of the copper.

Reference is made of the application Serial No. 261,277, filed December 12, 1951 of C. S. Fuller, now United States Patent 2,771,382, wherein a related invention is disclosed.

What is claimed is:

1. The method of fabricating a semiconductive body for signal translating devices which comprises applying a coating of gold to one surface of a body of N-type germanium, placing a copper particle on the gold coating, and heating the assembly at a temperature between about 600° C. and 900° C. to diffuse copper into said body.

2. The method of fabricating a semiconductive element for signal translating devices which comprises cleaning the surfaces of a body of N-type germanium, plating said surfaces with gold, fusing the gold to the germanium, applying a copper particle to one of said surfaces, and heating the assembly in an inert atmosphere at a temperature between about 600° C. and 900° C. for a period between a few and about one hundred twenty seconds.

3. The method of fabricating a semiconductive body for signal translating devices which comprises preparing a clean surface on a body of N-type germanium, placing a copper particle on said surface, heating the assembly at a temperature between about 600° C. and 900° C. in an inert atmosphere for a period between a few and about one hundred twenty seconds, thereby to form in said body a pair of NP junctions intersecting said surface and disposed one behind the other, and forming on said surface a metal coating short circuiting the junction nearest said surface.

4. The method of fabricating a semiconductive body for signal translating devices which comprises cleaning a surface of a wafer of N-type germanium, applying a coating of gold to said surface, placing a particle of copper on the gold coating, placing indium over the copper particle, and heating the assembly at a temperature between about 600° C. and 900° C. in an inert atmosphere.

5. The method of fabricating a semiconductive body for signal translating devices which comprises cleaning the opposed major faces of a wafer of N-type germanium, placing a pair of copper particles each in contact with a respective one of said surfaces, heating the wafer and particles at a temperature between about 600° C. and 900° C. in an inert atmosphere, to diffuse copper into said wafer from said surfaces to a depth less than one-half the thickness of said wafer, cooling the assembly, whereby there are formed in said wafer two pairs of NP junctions one adjacent each of said surfaces, the junctions of each pair intersecting the respective surface and being positioned one behind the other, and short circuiting the junction of one of said pairs nearest the respective surface.

6. The method of fabricating a semiconductive element for signal translating devices which comprises applying a coating of gold over all faces of a wafer of N-type germanium, placing a pair of copper particles in contact with said coating on opposite major faces of said wafer, covering one of said particles with a layer of indium, and heating the assembly at a temperature between about 600° C. and 900° C. in an inert atmosphere.

7. The method of fabricating a semiconductive body for signal translating devices which comprises abrading a surface of N conductivity type germanium of the order of 10 ohm centimeter resistivity, removing loose particles from said surface, gold plating said surface, applying a particle of copper to said surface, heating the assembly in an inert atmosphere at a temperature of the order of 800° C. for a time of the order of twenty-five seconds, quenching the assembly, removing the gold from said surface, and then chemically etching said surface.

References Cited in the file of this patent

UNITED STATES PATENTS

| | | |
|---|---|---|
| 2,561,411 | Pfann | July 24, 1951 |
| 2,588,253 | Lark-Horovitz et al. | Mar. 4, 1952 |
| 2,597,028 | Pfann | May 20, 1952 |